United States Patent
Peters

(10) Patent No.: US 7,531,378 B2
(45) Date of Patent: May 12, 2009

(54) FORMING AN INTERMEDIATE ELECTRODE BETWEEN AN OVONIC THRESHOLD SWITCH AND A CHALCOGENIDE MEMORY ELEMENT

(75) Inventor: John M. Peters, San Jose, CA (US)

(73) Assignee: Ovonyx, Inc., Rochester Hills, MI (US)

( * ) Notice: Subject to any disclaimer, the term of this patent is extended or adjusted under 35 U.S.C. 154(b) by 203 days.

(21) Appl. No.: 11/724,112

(22) Filed: Mar. 14, 2007

(65) Prior Publication Data

US 2008/0224116 A1    Sep. 18, 2008

(51) Int. Cl.
*H01L 21/00* (2006.01)
*H01L 21/44* (2006.01)

(52) U.S. Cl. .............................. 438/95; 257/4; 257/614
(58) Field of Classification Search .................. 257/4, 257/614, 616, 774; 438/93–95
See application file for complete search history.

(56) References Cited

U.S. PATENT DOCUMENTS 5,789,277 A * 8/1998 Zahorik et al. ............... 438/95
6,420,725 B1 * 7/2002 Harshfield ...................... 257/4

* cited by examiner

*Primary Examiner*—Calvin Lee
(74) *Attorney, Agent, or Firm*—Trop, Pruner & Hu, P.C.

(57) ABSTRACT

An intermediate electrode between an ovonic threshold switch and a memory element may be formed in the same pore with the memory element. This may have many advantages including, in some embodiments, reducing leakage.

9 Claims, 2 Drawing Sheets

FORMING AN INTERMEDIATE ELECTRODE BETWEEN AN OVONIC THRESHOLD SWITCH AND A CHALCOGENIDE MEMORY ELEMENT

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

Figure 1:
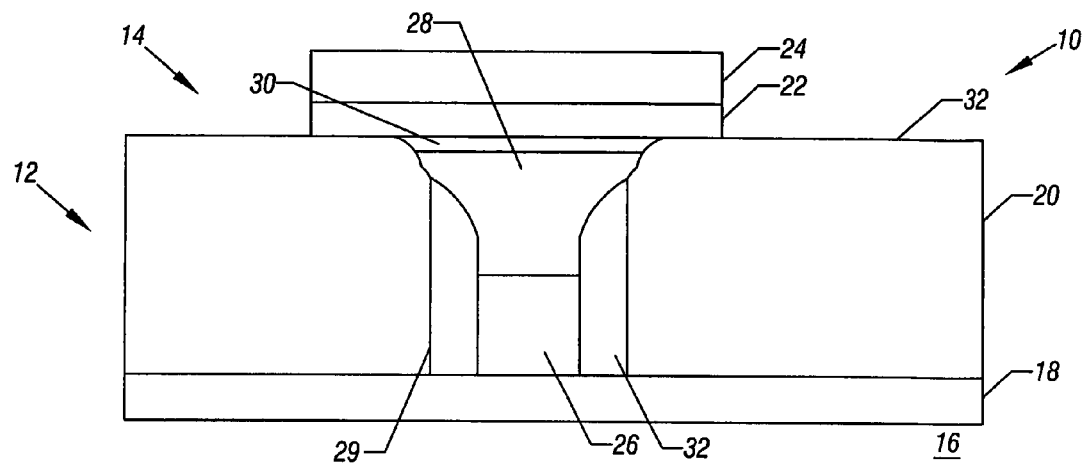
FIG. 1 is an enlarged, cross-sectional view of one embodiment of the present invention.

Referring to FIG. 1, an ovonic unified memory (OUM) 10 may include an ovonic threshold switch 14 over a memory element 12. In one embodiment of the present invention, the ovonic threshold switch 14 may be made by a so-called dot process so that the ovonic threshold switch is in the form of a stack of layers with aligned, etched, side edges positioned over the memory element.

The memory element 12 may be formed on a semiconductor substrate 16. It may include a metallization or lower electrode 18 which, in one embodiment, may provide a signal line or row line.

A dielectric material 20 may be formed above the metallization 18. Suitable dielectrics include oxide and nitride. A pore 29 may be formed through the dielectric material 20 vertically down to the metallization 18. Within the pore 29 may be a sidewall spacer 32, a heater element 26, a chalcogenide material 28, and an intermediate electrode 30. The intermediate electrode 30 may be aligned within the pore 29 in one embodiment.

Over the intermediate electrode 30 and making contact thereto is the ovonic threshold switch 14. It may include a chalcogenide layer 22 that is always in its amorphous state and does not change phase during normal operation of the switch. The top electrode 24 may act as the top electrode of the entire memory 10. The top electrode 24 and chalcogenide layer 22 may be masked and dry etched.

Thus, in some embodiments, the intermediate electrode 30 couples the ovonic threshold switch 14 to the memory element 12. It may serve to reduce leakage, in some embodiments, because, unlike conventional devices, the intermediate electrode 30 is provided within the pore 29 which also defines the memory element 12. More conventionally, the intermediate electrode is patterned and etched as part of the ovonic threshold switch stack.

Figure 2:
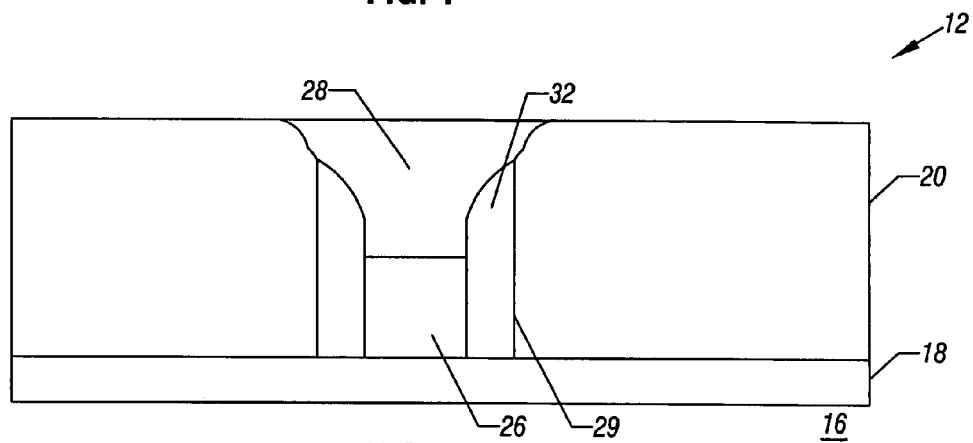
FIG. 2 is an enlarged, cross-sectional view at an early stage of manufacture in accordance with one embodiment of the present invention.

Referring to FIG. 2, initially, the pore 29 may be formed with a spacer 32. Any conventional dielectric may be formed as the spacer using conventional spacer formation processes, including deposition and anisotropic etch. A heater element 26 may be formed in contact with the metallization 18. Many techniques for forming the heater element 26 may be utilized, including a dip back technique wherein the heater element is partially removed from the pore. The chalcogenide material 28 may be deposited and then planarized. As a result, the chalcogenide material 28 has a V-shaped configuration due to the fact that the tops of the spacers 32 tend to be etched away, therefore, creating a wider upper region of the pore compared to its lower region.

Figure 3:
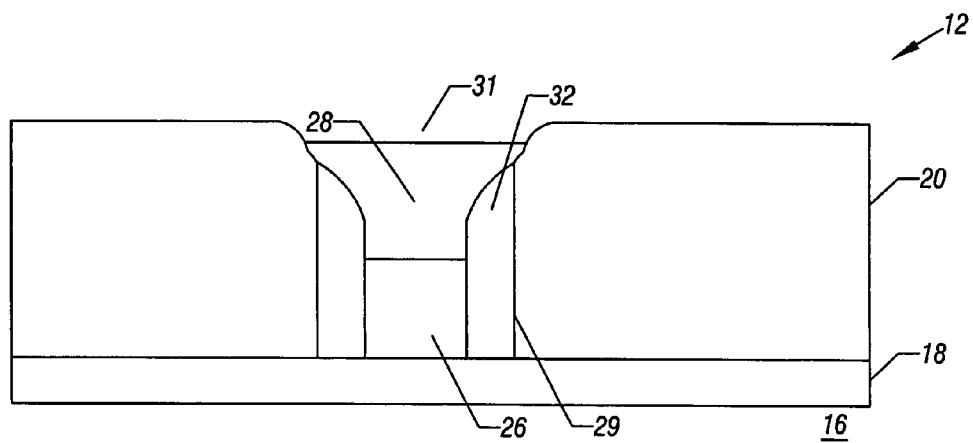
FIG. 3 is an enlarged, cross-sectional view at a subsequent stage in accordance with one embodiment of the present invention.

Referring to FIG. 3, in accordance with some embodiments, a recess 31 may be formed in the pore 29 and its upper extent. This may be done by a variety of techniques including, for example, sputter etching, wet etching, or aggressive chemical mechanical planarization in the course of planarizing the chalcogenide material 28. In some embodiments, the recess 31 may be on the order of about 200 Angstroms in depth.

Figure 4:
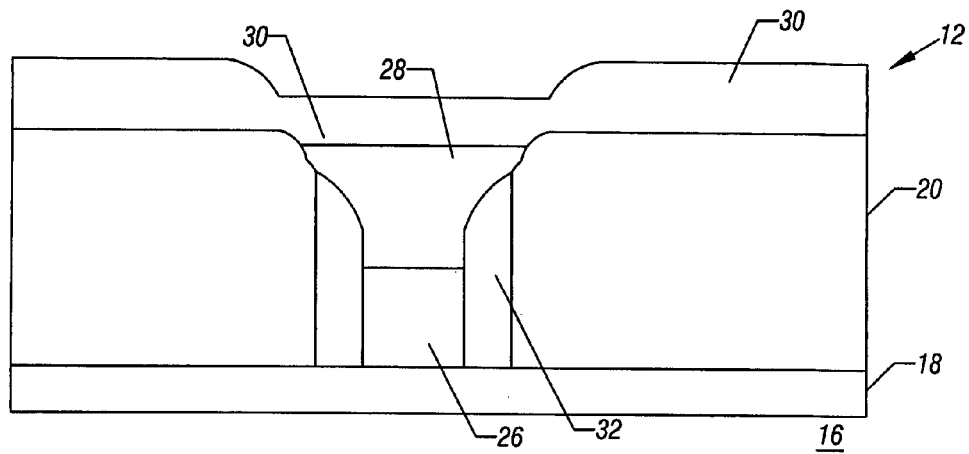
FIG. 4 is an enlarged, cross-sectional view at a subsequent stage in accordance with one embodiment of the present invention.

Then, referring to FIG. 4, an intermediate electrode 30 may be deposited using any conventional technique. The intermediate electrode 30 may be formed of a conductive material that does not react with the chalcogenides used for the layer 22 or material 28. Suitable materials for the intermediate electrode 30 include the following materials: titanium aluminum nitride, carbon, tantalum nitride, or molybdenum nitride, to give a few examples.

Figure 5:
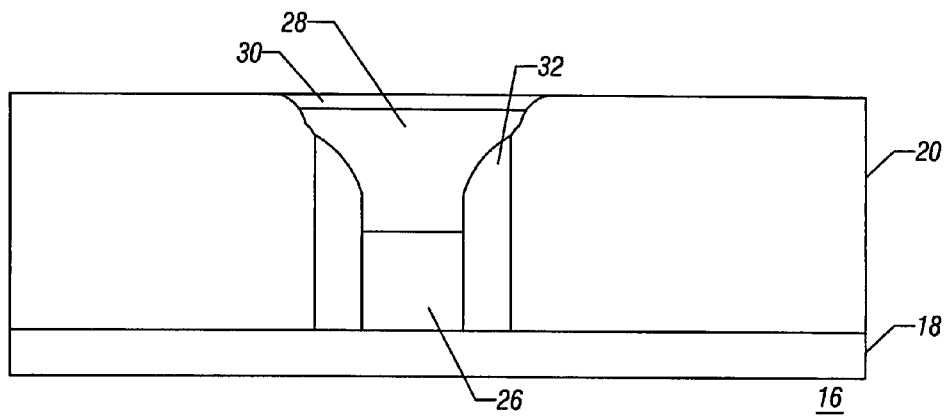
FIG. 5 is an enlarged, cross-sectional view at a subsequent stage in accordance with one embodiment of the present invention.

Finally, referring to FIG. 5, the intermediate electrode 30 may be chemically mechanically polished or otherwise planarized so that its upper surface is coplanar with the upper surface of the dielectric material 20. As a result, the intermediate electrode 30 is recessed within the recess 31 and appears as part of the memory element 12. Thereafter, the ovonic threshold switch 14 may be formed by depositing a series of layers and then using a mask to etch the layers with aligned edges to achieve the dot stack structure shown in FIG. 1.

In some embodiments, the intermediate electrode 30 may be self-aligned to reduce the contact area and thereby leakage. The edge of the ovonic threshold switch 14 may be inhomogeneous due to interaction with processing such as the etching and subsequent thermal steps. As a result of the configuration shown in FIG. 1, in some embodiments, the intermediate electrode 30 does not extend into this inhomogeneous region. For example, the edges of the electrode 30 and switch 14 may be offset with the switch extending beyond both edges of said electrode. In addition, the intermediate electrode may not extend to the edge of the dot stack, forming the ovonic threshold switch 14 which may reduce edge leakage mechanisms.

Because of the self-alignment to the memory element 12, the smallest possible geometric area may be achieved, in some embodiments, which is favorable for reducing device leakage.

A series connected select device in the form of the ovonic threshold switch 14 may be used to access a memory element 12, including the phase change material 28, during programming or reading of memory element. A select device may be an ovonic threshold switch that can be made of a chalcogenide alloy that does not exhibit an amorphous to crystalline phase change and which undergoes rapid, electric field initiated change in electrical conductivity that persists only so long as a holding voltage is present.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or a switch.

In one embodiment, each select device may comprise a switching material such as, for example, a chalcogenide alloy, and may be referred to as an ovonic threshold switch, or simply an ovonic switch. The switching material of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be a programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current, $I_H$. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element may be about equal to the threshold current of the access device even though its snapback voltage is greater than the memory element's reset bit threshold voltage.

Programming of the chalcogenide 28 to alter the state or phase of the material may be accomplished by applying voltage potentials to the lower electrode 18 and top electrode 24, thereby generating a voltage potential across the select device and memory element. When the voltage potential is greater than the threshold voltages of select device and memory element, then an electrical current may flow through the chalcogenide 28 in response to the applied voltage potentials, and may result in heating of the chalcogenide 28.

This heating may alter the memory state or phase of the chalcogenide 28. Altering the phase or state of the chalcogenide 28 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

Figure 6:
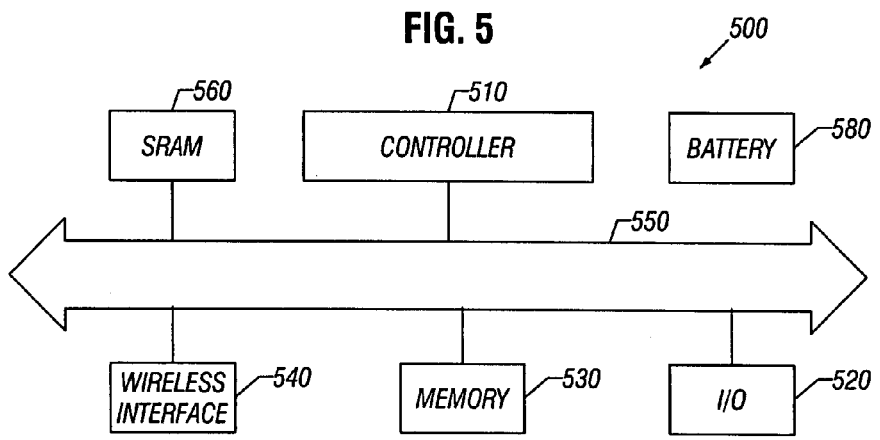
FIG. 6 is a system depiction in accordance with one embodiment of the present invention.

Turning to FIG. 6, a portion of a system 500 in accordance with an embodiment of the present invention is described. System 500 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a chalcogenide memory element in a pore;
    forming an ovonic threshold switch over said pore; and
    forming an intermediate electrode in said pore between said ovonic threshold switch and said memory element wherein forming an ovonic threshold switch includes depositing a second chalcogenide over the intermediate electrode.

2. The method of claim 1 including depositing chalcogenide in said pore and planarizing said chalcogenide.

3. The method of claim 2 including removing some of said chalcogenide from said pore to form a recess over said memory element.

4. The method of claim 3 including depositing an electrode material in said recess.

5. The method of claim 4 including planarizing said electrode material to form said intermediate electrode.

6. The method of claim 1 including depositing a top electrode over said second chalcogenide.

7. The method of claim 6 including masking said top electrode and using said mask to etch both the top electrode and said second chalcogenide.

8. The method of claim 1 wherein forming an intermediate electrode includes forming the intermediate electrode entirely with said pore.

9. The method of claim 8 including forming said pore through dielectric material.

* * * * *